(12) United States Patent
Wachi et al.

(10) Patent No.: US 7,176,701 B2
(45) Date of Patent: Feb. 13, 2007

(54) SEMICONDUCTOR DEVICE, TEMPERATURE SENSOR, AND ELECTRONIC APPARATUS COMPRISING IT

(75) Inventors: Takatsugu Wachi, Kyoto (JP); Akira Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 68 days.

(21) Appl. No.: 10/504,856

(22) PCT Filed: Mar. 10, 2003

(86) PCT No.: PCT/JP03/02810

§ 371 (c)(1),
(2), (4) Date: Jan. 10, 2005

(87) PCT Pub. No.: WO03/076886

PCT Pub. Date: Sep. 18, 2003

(65) Prior Publication Data

US 2005/0104151 A1    May 19, 2005

(30) Foreign Application Priority Data

Mar. 11, 2002  (JP)  ............................. 2002-065383
Mar. 4, 2003   (JP)  ............................. 2003-057430

(51) Int. Cl.
*G01R 27/08*  (2006.01)
*G01R 31/28*  (2006.01)
*G01R 31/02*  (2006.01)
*H01L 35/00*  (2006.01)

(52) U.S. Cl. .................. 324/721; 324/158.1; 324/537; 324/760; 327/512

(58) Field of Classification Search ............... 324/760, 324/721; 327/512, 513; 257/470; 374/178
See application file for complete search history.

(56) References Cited

U.S. PATENT DOCUMENTS

| 4,574,205 | A | * | 3/1986 | Nagano | ....................... 327/512 |
| 5,094,546 | A | * | 3/1992 | Tsuji | ........................... 374/178 |
| 6,084,462 | A | * | 7/2000 | Barker | ....................... 327/512 |
| 6,509,782 | B2 | * | 1/2003 | Chowdhury | ................ 327/512 |
| 6,812,722 | B2 | * | 11/2004 | Throngnumchai et al. | .. 324/760 |

FOREIGN PATENT DOCUMENTS

| JP | 58-23578 B2 | 5/1983 |
| JP | 4-31721 A | 2/1992 |

\* cited by examiner

*Primary Examiner*—Andrew H. Hirshfeld
*Assistant Examiner*—Amy He
(74) *Attorney, Agent, or Firm*—Arent Fox PLLC

(57) ABSTRACT

A temperature sensor including two transistors having different emitter current densities and performing temperature detection based on the fact that the difference in voltage between base and emitter changes with temperature. The temperature sensor is provided with a feedback circuit for controlling respective collector voltages and emitter currents such that the collector voltages of both transistors vary according to similar temperature characteristics.

6 Claims, 2 Drawing Sheets

SEMICONDUCTOR DEVICE, TEMPERATURE SENSOR, AND ELECTRONIC APPARATUS COMPRISING IT

CROSS-REFERENCE TO RELATED APPLICATION

This application is a National Stage entry of International Application No. PCT/JP02/02810, filed Mar. 10, 2003, the entire specification claims and drawings of which are incorporated herewith by reference.

TECHNICAL FIELD

The present invention relates to a temperature sensor. In particular, the present invention relates to an integrated-circuit-type temperature sensor that exploits the phenomenon in which the base-emitter voltage of a bipolar transistor varies approximately rectilinearly according to the ambient temperature.

BACKGROUND ART

FIG. 2 is a circuit diagram showing a conventional example of an integrated-circuit-type temperature sensor. The integrated-circuit-type temperature sensor 1a shown in this figure includes two npn-type transistors Q1 and Q2 having different emitter areas (here, the area ratio is 1:10), and achieves detection of the ambient temperature T on the basis of the voltage difference $\Delta VF$ (=VBE1−VBE2) between the base-emitter voltages VBE1 and VBE2 of the two transistors Q1 and Q2.

The collectors of the transistors Q1 and Q2 are connected, via constant current sources I1 and I2 respectively, to a supply voltage line so that constant currents ic1 and ic2 are fed to their collectors. The collector of the transistor Q1 is also connected to the base of an npn-type transistor Q4. The emitters of the transistors Q1 and Q2 are connected together, and their node is connected via a constant current source I3 to ground. The base of the transistor Q1 is connected to the emitter of the transistor Q4, and is also to one end of a resistor R1. The base of the transistor Q2 is connected to the other end of the resistor R1, and is also connected via a resistor R2 to ground. The collector of the transistor Q4 is connected to the supply voltage line.

The integrated-circuit-type temperature sensor 1a shown in FIG. 1 is so configured that the base of the transistor Q1 serves as an output terminal Tout, from which an output voltage Vout is obtained. Accordingly, the output voltage Vout is given by formula (1) below.

$$Vout = \frac{R1+R2}{R1} \cdot \Delta VF \quad (1)$$

On the basis of the diode equation, the voltage difference $\Delta VF$ included in formula (1) above can be unfurled to an expression given by formula (2) below.

$$\Delta VF = VBE1 - VBE2 \quad (2)$$

$$= \frac{k \cdot T}{q} \cdot \ln\left[\frac{ic1}{1 \cdot \left(1 + \frac{VCE1}{VA}\right) \cdot IS}\right] - \frac{k \cdot T}{q} \cdot \ln\left[\frac{ic2}{1 \cdot \left(1 + \frac{VCE2}{VA}\right) \cdot IS}\right]$$

$$= \frac{k \cdot T}{q} \cdot \ln\left[10 \cdot \frac{ic1\left(1 + \frac{VCE2}{VA}\right)}{ic2\left(1 + \frac{VCE1}{VA}\right)}\right]$$

In formula (2) above, k represents the Boltzmann constant; T represents the ambient temperature (absolute temperature); q represents the electric charge of an electron; ic1 and ic2 represent the collector currents of the transistors Q1 and Q2; VCE1 and VCE2 represent the collector-emitter voltages of the transistors Q1 and Q2; VA represents the Early voltage of the transistors Q1 and Q2; and IS represents the leak current of the transistors Q1 and Q2.

As will be understood from formula (2) above, the voltage difference $\Delta VF$ between the base-emitter voltages VBE1 and VBE2 of the transistors Q1 and Q2, which have different emitter current densities, varies according to the ambient temperature T. Moreover, on the basis of the correlation expressed by formula (1) above, the output voltage Vout of the integrated-circuit-type temperature sensor 1a also varies according to the ambient temperature T.

FIG. 3 is a correlation diagram showing the dependence of the voltage difference $\Delta VF$ (or the output voltage Vout) on the ambient temperature T. In this figure, the horizontal axis represents the ambient temperature T, and the vertical axis represents the voltage difference $\Delta VF$ (or the output voltage Vout). Incidentally, in a case where the collector currents ic1 and ic2 of the transistors Q1 and Q2 are equal and their collector-emitter voltages VCE1 and VCE2 are equal, the voltage difference $\Delta VF$ varies, as expressed by formula (3) below, in an ideal manner, i.e., in proportion to the ambient temperature T (as indicated by a broken line in the figure).

$$\Delta VF = \frac{k \cdot T}{q} \cdot \ln 10 \quad (3)$$

Indeed, the integrated-circuit-type temperature sensor 1a configured as described above permits the ambient temperature T to be detected with a certain degree of high accuracy on the basis of the output voltage Vout appearing at the output terminal Tout, and thus can be used as a temperature detecting means in various apparatuses.

However, in the integrated-circuit-type temperature sensor 1a configured as described above, the currents flowing through the collectors of the transistors Q1 and Q2 vary in different manners. Accordingly, the collector current ratio ic1/ic2 between the transistors Q1 and Q2 and the collector-emitter voltage ratio VCE1/VCE2 between them vary according to the ambient temperature T, producing errors. Thus, disadvantageously, as indicated by a solid line in FIG. 3, the voltage difference $\Delta VF$ deviates irregularly from the ideal straight line expressed by formula (3) above. For this reason, the integrated-circuit-type temperature sensor 1a configured as described above often proves to be unsuitable as a temperature sensor for use in a controlling or driving apparatus for an electronic apparatus (for example, a hard disk drive apparatus or DVD drive apparatus incorporated in a car navigation system) that needs to detect the ambient temperature with high accuracy and high linearity.

DISCLOSURE OF THE INVENTION

In view of the conventionally encountered disadvantage mentioned above, it is an object of the present invention to provide a temperature sensor that permits detection of the ambient temperature with high accuracy and high linearity.

To achieve the above object, according to the present invention, a temperature sensor that includes two transistors having different emitter current densities and that detects temperature by exploiting the phenomenon in which the difference between the base-emitter voltages of the two transistors varies according to temperature is provided with a feedback circuit for controlling the collector voltages and/or emitter currents of the two transistors such that the collector voltages of the two transistors vary with similar temperature responses.

BEST MODE FOR CARRYING OUT THE INVENTION

Figure 1:
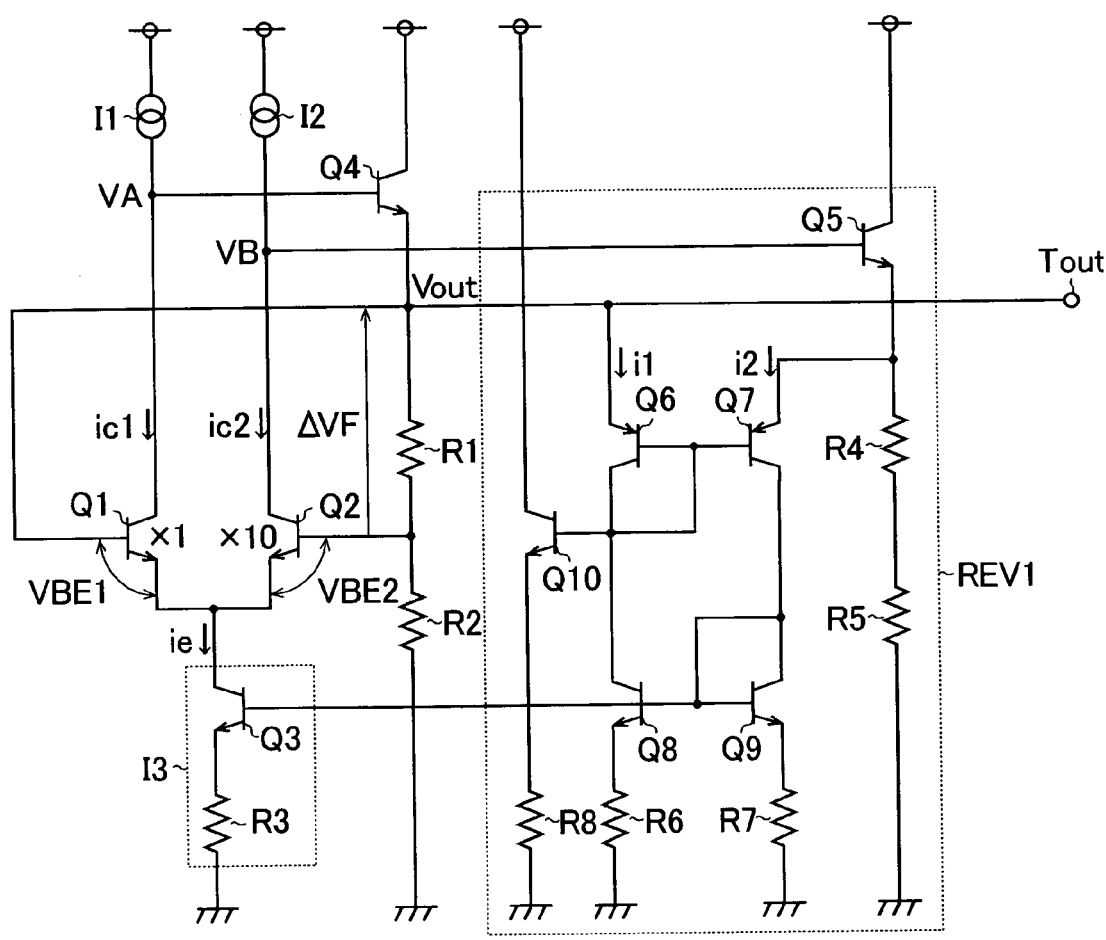
FIG. 1 is a circuit diagram showing an integrated-circuit-type temperature sensor embodying the invention.
Figure 2:
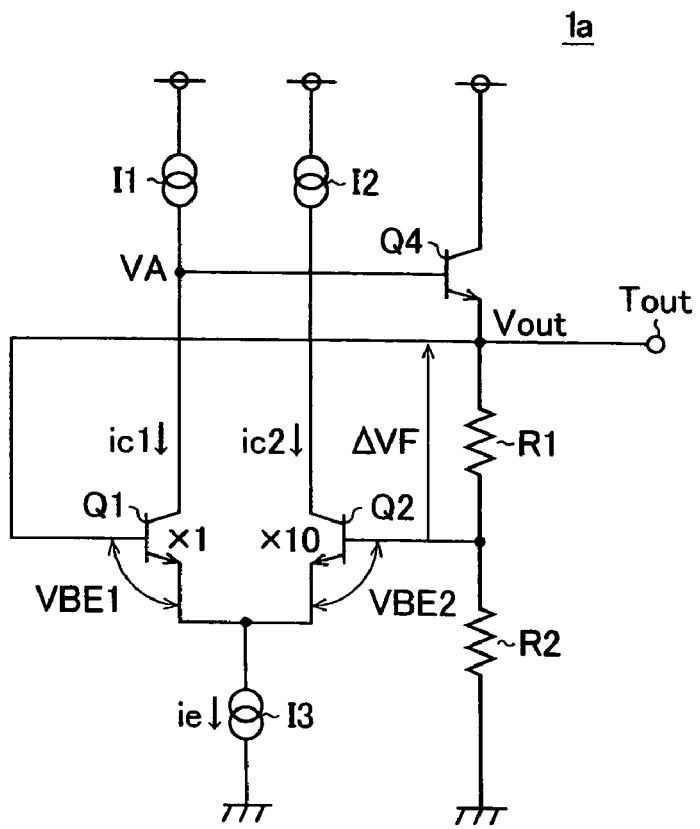
FIG. 2 is a circuit diagram showing a conventional example of an integrated-circuit-type temperature sensor.
Figure 3:
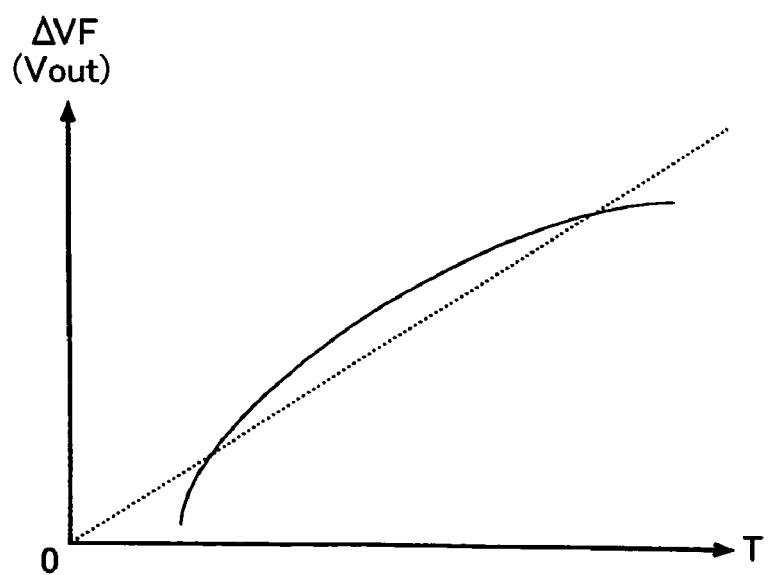
FIG. 3 is a correlation diagram showing the dependence of the voltage difference $\Delta VF$ on the ambient temperature T.

FIG. 1 is a circuit diagram showing an integrated-circuit-type temperature sensor embodying the invention. The integrated-circuit-type temperature sensor 1 of this embodiment includes, in addition to the conventional configuration shown in FIG. 2, a feedback circuit REV1 for controlling the collector voltages VA and VB of the transistors Q1 and Q2 and their emitter current ie such that the collector voltages VA and VB of the transistors Q1 and Q2 vary with similar temperature responses. Accordingly, such components as are found also in the conventional integrated-circuit-type temperature sensor 1a are identified with the same reference symbols as those used in FIG. 2, and their explanations will be omitted. In the following description, emphasis is placed on the characteristic features of this embodiment, namely the configuration and operation of the feedback circuit REV1.

As shown in FIG. 1, the feedback circuit REV1 of this embodiment includes: an npn-type transistor Q5 that is provided so as to correspond to the transistor Q4; pnp-type transistors Q6 and Q7 that together form a current mirror circuit; npn-type transistors Q8 and Q9 that together form a current mirror circuit; an npn-type transistor Q10 that forms a starting circuit that determines the operation status of the feedback circuit REV1 at start-up; and resistors R4 to R8.

The collector of the transistor Q5 is connected to the supply voltage line. The base of the transistor Q5 is connected to the collector of the transistor Q2. The emitter of the transistor Q5 is connected to the emitter of the transistor Q7, and is also connected via the resistors R4 and R5 to ground. The resistors R4 and R5 are resistive elements that have resistances equal to the resistances of the resistors R1 and R2.

The emitter of the transistor Q6 is connected to the output terminal Tout. The collectors of the transistors Q6 and Q7 are connected respectively to the collectors of the transistors Q8 and Q9. The bases of the transistors Q6 and Q7 are connected together, and their node is connected to the collector of the transistor Q6.

The emitters of the transistors Q8 and Q9 are connected, via the resistors R6 and R7 respectively, to ground. The bases of the transistors Q8 and Q9 are connected together, and their node is connected to the collector of the transistor Q9. The bases of the transistors Q8 and Q9 are also connected to the base of an npn-type transistor Q3 provided within the constant current source 13. The collector of the transistor Q3 is connected to the emitter of each of the transistors Q1 and Q2. The emitter of the transistor Q3 is grounded via the resistor R3.

The base of the transistor Q10 is connected to the node at which the collector and base of the transistor Q6 and the collector of the transistor Q8 are connected together. The collector of the transistor Q10 is connected to the supply voltage line. The emitter of the transistor Q10 is connected via the resistor R8 to ground.

Configured as described above, the feedback circuit REV1 operates as follows. Through the emitter of the transistor Q6 flows a current i1 commensurate with the collector voltage VA of the transistor Q1; through the emitter of the transistor Q7 flows a current i2 commensurate with the collector voltage VB of the transistor Q2. Now, suppose that, according to the ambient temperature T, the collector voltage VA of the transistor Q1 has varied. In response, first the emitter current i1 of the transistor Q6 varies, and then, following it, the emitter current i2 of the transistor Q7 varies. Thus, the operating voltage of the transistors Q9 and Q8 is determined, and the transistor Q3 determines the emitter current ie of the transistors Q1 and Q2. As a result, in the feedback circuit REV1 of this embodiment, feedback control (so-called common mode feedback control) is performed on the collector voltage VB of the transistor Q2 and the emitter current ie of the transistors Q1 and Q2 such that the currents i1 and i2 are kept equal.

Configured as described above, the integrated-circuit-type temperature sensor 1 of this embodiment makes it less likely for errors to occur in the collector current ratio ic1/ic2 between the transistors Q1 and Q2 and the collect-emitter voltage ratio VCE1/VCE2 between them. This makes it possible to detect the ambient temperature T with high accuracy and high linearity.

In the integrated-circuit-type temperature sensor 1 of this embodiment, the transistors Q4 and Q5 are made identical in size and characteristics, the transistors Q6 and Q7 are made identical in size and characteristics, and the resistors R6 and R7 are made identical in size and characteristics. Accordingly, the collector voltage VA of the transistor Q1 is determined by the output voltage Vout and the operating voltage of the transistor Q4, and the collector voltage VB of the transistor Q2 is determined by the output voltage Vout and the operating voltages of the transistors Q5, Q6, and Q7. Thus, the collector voltages VA and VB are both less likely to be affected by variation of the supply voltage. Accordingly, the integrated-circuit-type temperature sensor 1 of this embodiment can detect temperature stably even when fed with different supply voltages (for example, 3 V and 5 V).

Moreover, in the feedback circuit REV1 of this embodiment, in addition to the current path by way of which the emitter current of the transistor Q5 is passed to the emitter of the transistor Q7, there is provided another current path by way of which the same emitter current is passed through the resistors R4 and R5, having the same resistances as the resistors R1 and R2, to ground. Providing this additional current path helps eliminate factors that cause errors in the currents i1 and i2 that flow into the emitters of the transistors Q6 and Q7, and thus makes it possible to detect the ambient temperature T with even higher accuracy and linearity. Needless to say, in cases where priority is given to reducing the chip scale, the additional current path may be omitted.

Furthermore, in the integrated-circuit-type temperature sensor 1 of this embodiment, the resistors R1, R2, R4, and R5 are so formed that their resistances can be adjusted by laser trimming or the like. With this design, even after the formation of the circuit, it is possible to freely adjust the dependence of the output voltage Vout on the ambient temperature T.

The embodiment described specifically above deals with a case where, for higher accuracy, the feedback circuit REV1 adopts two-stage current mirror circuits. It should be understood, however, that the present invention may be implemented with any other circuit configuration, so long as it realizes a function comparable to that achieved in the embodiment described above (i.e., the function of performing feedback control such that the collector voltages VA and VB of the transistors Q1 and Q2 vary with similar temperature responses). This too is expected to offer accuracy higher than conventionally obtained.

INDUSTRIAL APPLICABILITY

As described above, a temperature sensor according to the present invention and a semiconductor device incorporating it make less likely for errors to result from variation of the collector current ratio between transistors and the collector-emitter voltage ratio between them, and thus make it possible to detect the ambient temperature with high accuracy and high linearity. They can therefore be used more widely in controlling or driving apparatuses for electronic apparatuses (for example, hard disk drive apparatuses or DVD drive apparatuses incorporated in car navigation systems) that need to detect the ambient temperature with high accuracy and high linearity. Moreover, by using a temperature sensor according to the present invention in combination with a bandgap circuit, it is possible to build a high-accuracy bandgap circuit. Moreover, its comparatively small circuit scale permits it to be used as an analog IP, and in a thermal circuit (for thermal shutdown) within a multiple-function IC.

The invention claimed is:

1. A temperature sensor comprising first and second transistors having different emitter current densities and a feedback circuit for controlling collector voltages and emitter currents of the first and second transistors such that the collector voltages of the first and second transistors vary with similar temperature responses, the temperature sensor detecting temperature by exploiting a phenomenon in which a difference between base-emitter voltages of the first and second transistors varies according to temperature,
wherein the feedback circuit comprises:
a first current mirror circuit composed of
a third transistor through an emitter of which flows an emitter current commensurate with the collector voltage of the first transistor and
a fourth transistor through an emitter of which flows an emitter current commensurate with the collector voltage of the second transistor,
the emitter current of the fourth transistor being varied so as to follow variation of the emitter current of the third transistor; and
a second current mirror circuit of which an operating voltage is determined so as to follow variation of the emitter current of the fourth transistor, the second current mirror circuit determining the emitter currents of the first and second transistors.

2. A temperature sensor comprising:
a first transistor of an npn type
of which a collector is connected via a first constant current source to a supply voltage line, and
of which a base is connected to an output terminal;
a second transistor of an npn type
of which a collector is connected via a second constant current source to the supply voltage line, and
of which a base is connected to a node between first and second resistors connected in series between the output terminal and a ground line,
the second transistor having a different emitter current density from the first transistor;
a third transistor of an npn type
of which a collector is connected to emitters of the first and second transistors, and
of which an emitter is grounded via a third resistor;
a fourth transistor of an npn type
of which a collector is connected to the supply voltage line,
of which a base is connected to the collector of the first transistor, and
of which an emitter is connected to the output terminal;
a fifth transistor of an npn type
of which a collector is connected to the supply voltage line, and
of which a base is connected to the collector of the second transistor;
a sixth transistor of a pnp type
of which an emitter is connected to the output terminal, and
of which a collector and a base are connected together;
a seventh transistor of a pnp type
of which an emitter is connected to an emitter of the fifth transistor, and
of which a base is connected to the base of the sixth transistor;
an eighth transistor of an npn type
of which a collector is connected to the collector of the sixth transistor, and
of which an emitter is grounded via a sixth resistor; and
a ninth transistor of an npn type
of which a collector is connected to a collector of the seventh transistor,
of which the collector and a base are connected together,
of which an emitter is grounded via a seventh resistor, and
of which the base is connected to bases of the third and eighth transistors.

3. A temperature sensor according to claim 2,
wherein
the sixth and seventh transistors are identical in size and characteristics,
the eighth and ninth transistors are identical in size and characteristics, and
the sixth and seventh resistors are identical in size and characteristics.

4. A temperature sensor according to claim 2, further comprising:
fourth and fifth resistors connected in series between the emitter of the fifth transistor and the ground line, the fourth and fifth resistors having resistances equal to resistances of the first and second resistors.

5. A temperature sensor according to claim 4,
wherein the resistances of the first, second, fourth, and fifth resistors can be adjusted by trimming.

6. A temperature sensor according to claim 2, further comprising:
a tenth transistor of an npn type
of which a collector is connected to the supply voltage line,
of which a base is connected to a node between the collector of the sixth transistor and the collector of the eighth transistor, and
of which an emitter is grounded via an eighth resistor.

* * * * *